United States Patent [19]

Bickford et al.

[11] Patent Number: 5,318,803

[45] Date of Patent: Jun. 7, 1994

[54] CONDITIONING OF A SUBSTRATE FOR ELECTROLESS PLATING THEREON

[75] Inventors: Harry R. Bickford, Ossining, N.Y.; Dennis A. Canfield, Montrose, Pa.; Arthur E. Graham, Lexington, Ky.; Stephen L. Tisdale, Vestal, N.Y.; Alfred Viehbeck, Stormville, N.Y.

[73] Assignee: International Business Machines Corporation, Armonk, N.Y.

[21] Appl. No.: 614,669

[22] Filed: Nov. 13, 1990

[51] Int. Cl.$^5$ .............................................. B05D 1/00
[52] U.S. Cl. .................... 427/306; 427/304; 427/305; 427/443.1
[58] Field of Search ............. 427/306, 305, 304, 443.1

[56] References Cited

U.S. PATENT DOCUMENTS

| | | | |
|---|---|---|---|
| 2,938,805 | 5/1960 | Agens | 106/1.26 |
| 2,996,408 | 8/1961 | Lukes | 427/304 |
| 3,075,855 | 1/1963 | Agens | 427/437 |
| 3,075,856 | 1/1963 | Lukes | 427/437 |
| 3,666,549 | 5/1972 | Rhodenizer | 427/306 |
| 3,844,799 | 10/1974 | Underkofler | 106/1.26 |
| 3,937,857 | 2/1976 | Brummett et al. | 427/98 |
| 4,004,051 | 1/1977 | Kadison | 427/304 |
| 4,066,809 | 1/1978 | Alpaugh | 427/305 |
| 4,113,899 | 9/1978 | Henry | 427/443.1 |
| 4,152,467 | 5/1979 | Alpaugh | 427/437 |
| 4,383,016 | 5/1983 | Postupack | 427/443.1 |
| 4,478,883 | 10/1984 | Bupp | 427/305 |
| 4,668,354 | 5/1987 | Levy | 204/130 |
| 4,687,597 | 8/1987 | Siuta | 252/512 |
| 4,692,360 | 9/1987 | Manring | 427/443.1 |
| 4,759,952 | 7/1988 | Brasch | 427/306 |
| 4,764,401 | 8/1988 | Sirinyan et al. | 427/304 |
| 4,863,758 | 9/1989 | Rhodenizer | 427/304 |

FOREIGN PATENT DOCUMENTS 8803443  5/1988  PCT Int'l Appl. ................. 427/304

OTHER PUBLICATIONS

Kirk-Othmer "Encyclopedia of Chemical Technology" vol. 8, 1979 J. Wiley & Sons, p. 859.

*Primary Examiner*—Shrive Beck
*Assistant Examiner*—Vi Duong Dang
*Attorney, Agent, or Firm*—Pollock, Vande Sande & Priddy

[57] ABSTRACT

A dielectric substrate is conditioned for subsequent electroless plating thereon by contacting with a catalytic metal salt and then with a reducing agent and with an electroless metal plating bath followed by contacting with a second catalytic metal salt. In addition, a dielectric substrate is conditioned for electroless plating thereon by obtaining a substrate of a dielectric material that contains metal particles therein and contacting with a catalytic metal salt.

28 Claims, No Drawings

CONDITIONING OF A SUBSTRATE FOR ELECTROLESS PLATING THEREON

DESCRIPTION

1. Technical Field

The present invention is concerned with conditioning a dielectric material and is particularly concerned with treating a dielectric substrate to prepare the substrate for the subsequent electroless deposition of a conductive metal thereon. This conditioning can be in the holes and/or on the major surfaces of the substrate. The present invention finds particular applicability for the manufacture of printed circuit boards and printed circuit cards. A further object of this invention is to provide a catalytic surface onto which can be placed a pattern layer of material to allow subsequently the selective or patterned or full build electroless metal deposition to provide a patterned conductive layer on the surface.

2. Background Art

In the manufacture of printed circuit cards and boards, a dielectric material is employed as the substrate. A conductive circuit pattern is provided on one or both of the major surfaces of the substrate.

A conductive pattern can be formed on the surface of the substrate using a variety of known techniques. These known techniques include the subtractive technique where a layer of copper is etched to form the desired circuit pattern, the EDB (electroless direct bond) technique where copper is electrolessly plated directly on the surface of the substrate in the desired pattern, the peel-apart technique where the desired circuit pattern is plated up from a thin layer of peel-apart copper. In any of these techniques, connections between layers are made by means of plated throughholes. In plating such holes, copper must be plated directly on the dielectric substrate (on the walls of the holes). Furthermore, if one uses the EDB technique, one must plate directly on the surface of the substrate.

Since the dielectric substrate is non-conductive, in order to plate on the substrate (either on the walls of the holes or on the major surfaces of the substrate), the substrate must be seeded or catalyzed prior to the deposition of metal on the substrate, using, for instance, an electroless plating process.

Among the more widely employed procedures for catalyzing a substrate is the use of a stannous chloride sensitizing solution and a palladium chloride activator to form a layer of metallic palladium particles. For instance, one method for catalyzing a dielectric substrate is exemplified by U.S. Pat. No. 3,011,920 which includes sensitizing the substrate by first treating it with a solution of a colloidal metal, accelerating the treatment with a solution to remove uncatalytic material from the colloids on the sensitized dielectric substrate and then electrolessly depositing a metal coating on the sensitized substrate; for example, with copper from a solution of a copper salt and a reducing agent.

Also, as suggested, for example, in U.S. Pat. No. 3,009,608, a dielectric substrate can be pretreated by depositing a thin film of a "conductivator" type of metal particle such as palladium metal from a semi-colloidal solution onto the dielectric substrate to provide a conducting base which permits electroplating with conductive metal on the conductivated base.

Another technique involves the so-called "triple seeding" technique as described in U.S. Pat. No. 4,066,809. This technique preferred in U.S. Pat. No. 4,066,809 includes contacting the surfaces of the dielectric material with an aqueous stannous chloride sensitizing solution followed by contacting the surfaces of the dielectric material with an aqueous palladium chloride activator solution and then followed by contacting the surfaces of the dielectric material with an aqueous palladium chloride/stannous chloride/hydrochloric acid seeder bath.

The foregoing discussed methods have been satisfactory for electroless or electrolytic plating of thin layers of conductive materials on non-conductive dielectric substrates for many prior art applications. However, such processes could stand some improvement in that the subsequent metal coating does not always result in coating in all the desired locations in as continuous manner as desired. Moreover, many of the prior processes require excessive retention time in the conditioning baths thereby reducing the throughput of the plating process.

Other processes involve special surface treatments or surface roughening prior to deposition of the catalyst and electroless metal. In addition, further improvement in the adhesion between the plated metal and substrate is desired. Furthermore, it is desired to have a means of depositing in a full-build or all-additive fashion a patterned conductive metal layer onto a substrate surface through an electroless deposition process.

SUMMARY OF INVENTION

The present invention provides for increased efficiency in speed of the seeding or activation of a dielectric material for subsequent electroless plating. This, in turn, results in improved and more reliable electroless plating of conductive metals. The improved process provides for improved continuity of the subsequently deposited metal from the electroless metal plating bath. The processes of the present invention utilize redox exchange reactions. In particular, according to one aspect of the present invention, at least one surface of a dielectric substrate material is conditioned for the electroless plating of a conductive metal thereon by contacting the at least one surface with a catalytic metal salt or metal complex. The surface coated with the catalytic metal salt or complex is then contacted with a reducing agent and with an electroless metal plating bath. The reducing agent reduces the metal cations of the catalytic metal salt or complex to zero-valent metal. The electroless metal plating bath deposits metal on the substrate in the zero-oxidation state. The coated surface is then contacted with a second catalytic metal salt or complex. The second catalytic metal salt or complex undergoes ion exchange with the metal in the zero-oxidation state. The second catalytic metal salt or complex can be the same material as the first catalytic metal salt or complex or can be a different metal salt.

According to another aspect of the present invention, a substrate of a dielectric material containing metal particles therein is contacted with a catalytic metal salt or metal complex. The catalytic metal salt or complex undergoes ion exchange with the metal particles to thereby deposit metal as zero-valent atoms of the cation on the surface of the substrate.

According to another aspect of the present invention, a dielectric substrate is conditioned with a catalytic zero-valent state metal deposit or catalytic metal particles in a non-electrically continuous manner. Then applying onto the surface a patterned layer of material such as a photoresist, solder mask, or permanent screenable or photosensitive material, in which the patterned layer forms a negative image of the desired circuit pattern, so that electroless metal plating can be deposited onto these regions of catalyzed substrate surface which are exposed.

A further aspect of the present invention is that for full-additive electroless metalization, the patterned layer of material (e.g. permanent resist) does not need to be removed to ensure electrically isolated conductor regions, i.e., the catalytic metal deposit can remain under the permanent resist layer and is not electrically conductive, does not lead to current leakage, and survives normal temperature/humidity/bias testing without detrimental affect to the operation of the device.

BEST AND VARIOUS MODES FOR CARRYING OUT INVENTION

The process of the present invention is applicable to treating or conditioning a wide variety of dielectric (non-conductor) substrates. Dielectric substrates described in the prior art, including thermoplastic and thermosetting resins, and glass, may be treated in accordance with the present invention.

Typical thermosetting polymeric materials include epoxy, phenolic based materials, and polyamides. The dielectric materials may be molded articles of the polymers containing fillers and/or reinforcing agents such as glass-filled epoxy or phenolic base materials. Examples of some phenolic type materials include copolymers of phenol, resorcinol and cresol. Examples of some suitable thermoplastic polymeric materials include polyimides, polyetherimides; fluorinated polymeric materials such as polytetrafluoroethylene and polymers of trifluoromonochloroethylene, and polymers of hexafluoropropylene; polysulfones; polycarbonates; polyphenylenes nitrile rubbers; acrylonitrile-butadiene-styrene (ABS) polymers; and polyolefins such as polypropylene.

The present invention is especially advantageous for conditioning those materials that are not especially susceptible to conditioning by prior conventional techniques such as fluorinated polymeric materials and various polyimides such as polyetherimides (e.g.—Ultem ® from General Electric Corp.); polysulfones including Udel ® from Amoco; polyethersulfones such as Victrex ® from ICI Americas; polyarylsulfones such as Radel ® from Amoco; polyphenylsulfones such as Ryton ® from Phillips 66 and Fortron ® from celanese; aromatic polyester resins such as Xydar ® from Dartco, Inc.; Rynite ® from Dupont and Lexan ® from General Electric; and liquid crystal polymers including Vectra ® from Celanese.

Prior to the initiation of the process of the present invention for treating the dielectric substrate, the required through-holes in the circuit board can be made in the dielectric with the through-holes suitably cleaned and preconditioned.

Also, prior to the conditioning pursuant to the present invention, the substrate can be preconditioned with a solvent to swell the surface of the substrate. This may be especially desirable when employing those polymeric materials that are inherently hydrophobic and/or have a very low surface porosity such as the fluorinated polymeric materials and various polyimides such as the polyetherimides. The exposure to certain organic solvents causes solvent uptake and swelling which in turn tends to increase the uniformity of the metal seed and electroless deposit on the surface and thereby enhance the final metal adhesion to the surface and improve the adhesion reliability. However, this step is merely an optional step and is not essential to achieving the improved results obtained by the present invention. Examples of some suitable solvents include amides (e.g. N,N-dimethylformamide and N-methyl-2-pyrrolidone), nitriles (e.g. acetonitrile), amines (e.g. triethanolamine), dimethylsulfoxide, propylene carbonate, and $\gamma$-butyrolactone. N,N-dimethylformamide is especially suitable for pretreatment of polyetherimides. Alternatively, the surface can be pretreated with an aqueous solution of a surfactant to improve the wettability of the surface. A suitable surfactant is Gafac RE 610 (GAF Corp.) which is an organic phosphate ester.

In accordance with the present invention, the substrate is treated with an aqueous or non-aqueous composition of a catalytic metal salt or metal complex. The composition can be a solution or colloidal dispersion containing the metal salt or metal complex and preferably is an aqueous solution. The metal salt composition can be applied by any known technique such as spin coating, spraying or dipping. The solution can be organic or aqueous with the preferred being organic such as methanol, ethanol or ethylene glycol. Organic solvents are preferred and especially those with a relatively high vapor pressures in order to facilitate the subsequent removal of the solvent. Acidified aqueous solutions are also suitable for dissolving the metal salt or metal complex.

The compositions containing the metal salt contains such in a concentration of at least about 0.1 mM concentration and preferably about 0.1 to about 50 mM and most preferably about 0.5 to about 5 mM concentration. Suitable metal cations of the metal catalyst employed include precious metals such as palladium, platinum, gold, ruthenium, copper and nickel. Suitable metal salts include chlorides, sulfates, bromides and nitrates with or without solvent ligation and preferably palladium chloride, examples of metal complexes include $Pd(ACN)_2Cl_2$, $CuIP(OCH_3)_3$. Instead of the metal salt compositions, palladium/tin colloids as employed in prior art techniques can be used such as those disclosed in U.S. Pat. No. 4,478,883, disclosure of which is incorporated herein by reference.

According to preferred aspects of the present invention, the diluent employed along with the metal salt is removed from the substrate in order to insure the prevention of contamination of the subsequently to be applied electroless bath due to metal salt dissolution.

Next, the substrate is contacted with a reducing agent and with an electroless metal plating bath. According to preferred aspects of the present invention, the contact with the reducing agent and electroless metal plating bath is done simultaneously with the reducing agent being a part of the plating bath. Removal of the diluent is preferred so as to assure that none would be carried over into the electroless bath which could in turn lead to instability of the electroless bath. The reducing agent whether added separately or as part of the plating bath causes metal cations of the catalytic metal salt to be reduced to the zero-valent metal state on the surface of the substrate. Furthermore, the reduced metal catalyzes the electroless plating process thereby resulting in plating of metal on the surface of the substrate. The reduction potential of the reducing agent must be more negative than the reduction potential of the metal ion to the zero-valent metal. Suitable reducing agents include those typically used in electroless plating baths and preferably include formaldehyde, dimethylamine borane, diethylamine borane, sodium hypophosphite, sodium borohydride, hydrazine or aqueous solutions containing reduced salts or chelated metal ions or organic solvents containing reducing agents including organic anionic species, which are generated chemically by, for example, reacting the organic compound with an alkali metal or by direct electrochemical reduction of the organic compound.

The reducing agents can be reducing agents, per se, or produced such as in situ by electrochemical means. The reducing agents can be generated by chemical reaction such as by reacting benzoin and potassium tert-butoxide or be a compound having a strong electron donating power such as tetrakis(dimethylamino)ethylene.

Examples of suitable organic compounds that can be electrochemically reduced to provide the chemical reducing agent include, but are not limited to, the following groups of compounds: unsaturated aromatic hydrocarbons (e.g., anthracene) aldehydes and ketones (e.g., benzaldehyde, dibenzoylmethane), imides (e.g., N-n-butylphthalimide, N,N'-di-n-butyl-3,3',4,4'-biphenyl tetracarboxylic diimide), carbodiimides (e.g., bis-(p-chlorophenyl carbodiimide), aromatic heterocyclic nitrogen compounds (e.g., 9,10-diazaphenanthrene) anhydrides (e.g., 1,8-naphthalic anhydride, 3,3',4,4'-benzophenone tetracarboxylic dianhydride), quinones (e.g., 9,10-anthraquinone), quaternary aromatic nitrogen compounds (e.g., 1-ethylpyridinium bromide), azomethines (e.g., N-p-biphenylbenzalimine), immonium salts (e.g., N-ethyl-N-methyl benzophenone immonium salt), azo compounds (e.g., 4,4'-azobiphenyl), amine oxides (e.g., acridine N-oxide), nitro and nitroso compounds (e.g., 2-t-butylnitrobenzene), and organometallic compounds (e.g., dibiphenylchromium (I) iodide).

Benzil, 9-fluorenone, benzophenone and anthracene are examples of specific compounds that can be reduced to provide the chemical reducing agents suitable for carrying out the present invention. The compounds can be reduced by applying such to an electrochemical cell containing an anode and a cathode and then applying a voltage.

The compounds can be reduced electrochemically or by bulk electrolysis. Typically, this is done using a two-compartment cell whereby the compartments are separated by a sintered glass disk or frit having a porosity of less than about 8 $\mu$m. A salt bridge or semi-permeable membrane also could be used to separate the compartments. The working compartment is housed with a cathode electrode which is comprised of a metal such as platinum, mercury, or stainless steel. The anode electrode is comprised of a conductor such as platinum, carbon, or stainless steel. For potentiostatic operation, an appropriate reference electrode is positioned in the working compartment (e.g., Ag/0.1M Ag $NO_3$). The cell can be purged with an inert gas such as $N_2$ or argon using an inlet tube and one-way valve or operation can be done in a glove box under an inert atmosphere.

Electrochemical generation of the reducing agent is accomplished by either galvanostatic, potentiostatic, or voltage-controlled electrolysis. Typically, the current density range for galvanostatic reduction is 0.1 to 2 mA/$cm^2$. In potentiostatic mode, reduction is typically done by applying a potential to the cathode which is more negative (e.g., 50 mV or more) than the reduction potential for the organic compounds as measured against the same reference electrode.

Compounds such as potassium tert-butoxide can react with aromatic ketones and alcohols to form anionic species. For instance, potassium tert-butoxide reacts with benzoin to form the benzoin dianion.

According to preferred aspects of the present invention, the reducing agent employed is that present in the electroless metal plating bath since this eliminates a process step and simplifies the overall process.

Suitable electroless metal plating baths include nickel, copper, gold, cobalt, and palladium electroless metal plating baths with nickel and copper being preferred and copper being most preferred. The typical copper electroless metal plating baths and their method of application are disclosed in U.S. Pat. Nos. 3,844,799 and 4,152,467, disclosures of which are incorporated herein by reference.

The copper electroless metal plating bath is generally an aqueous composition which includes a source of cupric ion, a reducing agent, a complexing agent for the cupric ion, and a pH adjustor. The plating baths also typically include a cyanide ion source and a surfactant.

The cupric ion source is generally cupric sulfate or a cupric salt of the complexing agent to be employed. When employing cupric sulfate, it is typical to use amounts from about 3 to about 15 grams/liter and more typically from about 8 to about 12 grams/liter. The most common reducing agent employed is formaldehyde which typically is used in amounts from about 0.7 to about 7 grams per liter and more typically from about 0.7 to about 2.2 grams per liter. Examples of other reducing agents include formaldehyde precursors or derivatives such as paraformaldehyde, trioxane, dimethylhydantoin, glyoxal; borohydrides such as alkali metal borohydrides (sodium and potassium borohydride) and substituted borohydrides such as sodium trimethoxy borohydride; boranes such as amine boranes (isopropyl amine borane and morpholine borane). Hypophosphite reducing agents can be used for electroless nickel and copper plating baths.

Examples of some suitable complexing agents include Rochelle salts, ethylene diamine tetraacetic acid, the sodium (mono-, di-, tri- and tetra-sodium) salts of ethylene diamine tetraacetic acid, nitrilotetraacetic acid and its alkali salts, gluconic acid, gluconates, triethanol amine, glucono-(gamma)-lactone, modified ethylene diamine acetates such as N-hydroxy fohydroxyethyl ethylene diamine triacetate. In addition, a number of other suitable cupric complexing agents are suggested in U.S. Pat. Nos. 2,996,408, 3,075,856, 3,075,855 and 2,938,805. The amount of complexing agent is dependent upon the amount of cupric ions present in the solution and is generally from about 20 to about 50 grams/liter or in a 3-4 fold molar excess.

The plating bath can also contain a surfactant that assists in wetting the surface to be coated. A satisfactory surfactant is, for instance, an organic phosphate ester available under the trade designation Gafac RE-610. Generally, the surfactant is present in amounts from about 0.02 to about 0.03 grams/liter. In addition, the pH of the bath is also generally controlled, for instance, by the addition of a basic compound such as sodium hydroxide or potassium hydroxide in the desired amount to achieve the desired pH. The typical pH of the electroless plating bath is between about 11.6 and about 11.8.

Also, the plating bath usually contains a cyanide ion and most typically contains about 10 to about 25 milligrams per liter to provide a cyanide ion concentration in the bath within the range of 0.0002 to about 0.0004 molar. Examples of some cyanides which can be employed are the alkali metal, alkaline earth metals and ammonium cyanides. In addition, the plating baths can include other minor additives as is well known in the prior art.

The plating baths generally have a specific gravity within the range of 1.06 to 1.08. In addition, the temperature of the bath is typically maintained between 70° and 80° C., and more typically between about 70° and about 75° C. For a discussion of plating temperatures coupled with the more typical cyanide ion concentration, see U.S. Pat. No. 3,844,799.

Also, the oxygen content of the bath is generally maintained between about 2 ppm and about 4 ppm and preferably about 2.5 to about 3.5 ppm as discussed in U.S. Pat. No. 4,152,467. The oxygen content can be controlled by injecting oxygen and an inert gas to the bath.

The overall flow rate of gases into the bath is generally from about 1 to about 20 SCFM per 1000 gallons of bath and more typically from about 3 to about 8 SCFM per 1000 gallons of bath.

The contact of the substrate with the reducing agent and the electroless plating bath is generally from about 2 seconds to about 5 minutes and preferably about 5 to about 15 seconds. Although, the preferred aspect of the present invention involves the simultaneous contact of the substrate with the reducing agent and the electroless plating bath, such steps can be carried out sequentially with the reducing agent contacting the substrate first followed by the electroless plating bath.

Next, the substrate is contacted with a second metal salt composition. This second metal salt composition can be the same as the first metal salt composition or can be a different catalytic metal composition. Preferably, the catalytic metal salt composition contains metal cations of precious metals such as platinum, palladium, ruthenium, silver and gold. This contact results in the depositing of these metals in the zero-valent state on the surface of the substrate in exchange for oxidation of the electroless metal coating thereon and removal into the solution or dispersion of the metal salt composition. In other words, this step causes the electroless metal deposits such as the copper to be replaced with for example the catalytic metal on exposure to the catalytic metal salt composition. The preferred salt being palladium chloride. The function of this treatment is to enhance the catalytic activity of the surface by increasing the amount of seed metal to permit a uniform electroless metal deposit to form in minutes on subsequent immersion in an electroless plating bath.

This step of the process is usually completed within about 10 seconds to about 5 minutes and preferably about 30 seconds to about 1 minute.

Next, the substrate can then be coated by contact with an electroless plating bath such as the type discussed hereinabove and preferably with a nickel or copper electroless plating bath and most preferably a copper electroless plating bath. This electroless plating is usually carried out for about 3 to about 30 minutes and preferably about 3 to about 10 minutes. The coating rate is about 0.5 to about 3 microns thick of metal per hour. This electroless layer is used as a metal base layer for further electroless metal plating, or electrolytic metal plating and subetching or patterned electroplating through a resist layer.

According to another aspect of the present invention, a dielectric material filled with a electrically conductive metal can be provided onto a substrate such as by pattern or screen printing. Normally, the composition is provided in a thickness of about 10 to about 100 μm and preferably about 10 to about 20 μm microns. Typical polymers filled with electrically conductive metals are commercially available and include Ag/phenolic from Acheson; Cu/phenolic from Mitsui and Cu/epoxy from Ethone. Typical electrically conductive metals include copper, silver, gold, nickel, platinum, palladium and tin with copper being preferred. Although, any metal filler that will undergo an atom/ion redox exchange reaction can be employed. The surface containing the metal particles is then contacted with a composition containing a catalytic metal salt such as the catalytic metal salt compositions disclosed hereinabove and particularly the precious metal salt composition such as palladium, platinum, ruthenium, silver and gold with palladium chloride being the most preferred. This contact is typically carried out for about 10 seconds to about 5 minutes and preferably about 30 seconds to about 1 minute. The treatment results in the depositing of the catalytic metal in the zero-valent state onto the metal filled polymeric material in exchange for oxidation of the metal filler. For instance, as a result of this treatment, copper or stannous filler is replaced with, for example, palladium metal on exposure to a palladium chloride solution. This step results in enhancing the catalytic activity of the metal filled dielectric material by increasing the amount of seed or catalytic metal to provide a more uniform electroless metal deposit to form on subsequent immersion in an electroless plating bath.

Next, according to preferred aspects of the present invention, the substrate is rinsed in deionized water in order to remove any adsorbed non-zero valent metal salt or metal complex solution. In particular, due to solvent uptake and swelling, it is inevitable that some of the metal salt will be adsorbed onto or into the surface of the entire substrate. If the substrate is not thoroughly rinsed, the metal salt can dry on the surface of the substrate. By rinsing in an appropriate solution such as an alcohol or acidified aqueous solution, the unreduced metal salt will be completely removed. On the other hand, the reduced metal within the thick film metal filled dielectric material will remain. This permits one to pattern the substrate with a more highly active catalytic seed that results in a more reliable and uniform deposit resulting in better adhesion of the plated metal to the substrate.

Next, the substrate can be exposed to an electroless metal plating bath of the type disclosed hereinabove and preferably a nickel or copper plating bath and most preferably copper for a time required to deposit the thickness of metal desired.

In addition, if desired, in order to fully assure uniformity of the plated metal, the above treatment steps of exposure to the metal salt composition, rinsing and exposure to the electroless plating bath can be repeated.

The following non-limiting examples are presented to further illustrate the present invention.

EXAMPLE 1

A sample of Ultem ® material 5 inch × 5 inch × ⅛ inch thick is immersed in N,N-dimethylformamide (DMF) solution for about 1 minute and then air dried. The sample is then immersed in a solution of 5 mM $PdCl_2$ in DMF for about 1 minute and then air dried. Next, the sample is placed in an electroless copper plating bath having the following composition. About 15.6 gm $CuSO_4$, about 60 gm Rochelle salt, about 22 gm NaOH, about 20 mg Gafac-RE-610, and about 1 liter $H_2O$. The sample is plated for about 5 minutes, then rinsed with water and dried. The Cu metal deposit on the surface at this point is not electrically continuous over the surface. The sample is then immersed in the $PdCl_2$/DMF solution for about 1 minute, and followed by a water rinsing and air drying. The sample is returned to the electroless Cu plating solution for about 3 minutes which produces a uniform, electrically continuous Cu deposit.

EXAMPLE 2

An Ultem sample is processed as in Example 1 except using a 5 mM $PdCl_2$/methanol solution. Final results are as described in Example 1.

EXAMPLE 3

A glass filed epoxy (FR-4) substrate is processed as in Example 2, giving a similar Cu deposition result.

EXAMPLE 4

A sample of RO2800 TM (Rogers Corp.) reinforced fluoropolymer material is immersed in about 5 mM $PdCl_2$/DMF solution for about 3 minutes, and then air dried. Then, the sample is immersed in the electroless Cu bath for about 15 minutes and rinsed with water and air dried. The part is placed in the $PdCl_2$/methanol solution for about another 3 minutes, rinsed with methanol, air dried, and electroless Cu plated for about 5 minutes resulting in a continuous Cu deposit on the surface.

EXAMPLE 5

A sample of epoxy FR-4 substrate coated with a patterned layer of Riston T168 photoresist is processed as follows: about 1 minute in about 5 mM $PdCl_2$/methanol (MeOH), air dry, about 5 minutes electroless Cu, water rinse, and about 1 minute in about 5 mM $PdCl_2$/methanol. The resist is then stripped with a methylene chloride rinse, and methanol rinse followed by air drying. After about 20 minutes immersion in the electroless Cu bath, excellent resolved plated Cu features are deposited.

EXAMPLES 6-11

Five samples of Ultem substrates 2 inch×4 inch×⅛ inch are each immersed in an about 5 mM $PdCl_2$/MeOH solution for a different length of time as follows: 5 seconds, 15 seconds, 30 seconds, 1 minute, and 2 minutes and then air dried. The samples are then immersed in an electroless copper plating bath (as in Example 1) for about 1 minute, then rinsed with water and air dried. Electrical conduction testing using a two point contact shows that only the samples which are exposed to the Pd/MeOH solution for 1 minute and 2 minutes give an electrically continuous Cu film. The 5 seconds, 15 seconds and 30 seconds Pd/MeOH samples are then electroless Cu plated for about an additional 20 minutes, which results in a uniform electroless Cu film on all samples.

EXAMPLES 17-21

Five samples of Ultem substrates 2 inch×4 inch×⅛ inch are each immersed in an about 0.5 mM $PdCl_2$/MeOH solution for a different length of time as follows: 5 seconds, 15 seconds, 30 seconds, 1 minute and 2 minutes and then air dried. The samples are then immersed in an electroless copper plating bath (as in Example 1) for about 1 minute then rinsed with water and air dried. None of the sample shows surface conductivity even after an additional 30 minutes in the electroless Cu bath. After being exposed to the electroless Cu bath for a total of about 1 hour all the samples are electrically conductive.

EXAMPLES 22-26

Five samples of Ultem substrates are treated as described for Examples 17-21, except using a 0.1 mM $PdCl_2$/MeOH solution. None of the samples show conductive surfaces even after 1 hour in the electroless Cu solution.

EXAMPLE 27

A sample is prepared as described in Example 1. This sample is then electrolytically Cu plated using an acidic copper sulfate plating solution to a final thickness of about 1.4 mil. 2 mm lines are subetched into the Cu film for 90° peel testing. An average peel value of 5.8 lb/inch (minimum 4.8 lb/inch) is obtained.

EXAMPLE 28

An Ultem substrates 2 inch×4 inch×⅛ inch is immersed in an about 5 mM $PdCl_2$/MeOH solution for about 15 seconds then air dried. The sample is then immersed in an electroless copper plating bath (as in Example 1) for about 15 seconds, then rinsed with water and air dried. The sample is then immersed in the 5 mM $PdCl_2$/MeOH solution for about 30 seconds and then rinsed with MeOH and air dried. A layer of Hysol SR 1020-45K material is screen applied to the Ultem surface to give a patterned layer having 10 mil wide openings and 10 mil wide spaces. The sample is then exposed to an electroless Cu plating bath to give a final films thickness of about 1.4 mil. With the solder mask deposit in place, the leakage resistance between lines is >10,000 Mohms. After 250 hours at 85° C./90% relative humidity and 10 volt DC bias along adjacent lines, the resistance decreases to 6,000 Mohms which is an acceptable resistance value for printed circuit boards.

What is claimed is:

1. A method for conditioning at least one surface of a dielectric substrate material for the electroless plating of a conductive metal thereon, which comprises:
    contacting said at least one surface with a catalytic metal salt solution or metal complex solution or both;
    contacting the said at least one surface with a reducing agent to reduce the metal cations to zero-valent metal and with an electroless metal plating bath to deposit said metal in the zero-oxidation state on said at least one surface; and
    then contacting said at least one surface with a second catalytic metal salt or metal complex or both wherein the metal cation of said second catalytic metal salt or metal complex or both undergoes ion exchange with said metal in the zero-oxidation state and is at least one member is selected from the group consisting of palladium, platinum, ruthenium, silver and gold; and then contacting said at least one surface with a second electroless metal plating bath after contacting with said second catalytic metal salt or metal complex or both to thereby deposit a metal layer thereon.

2. The method of claim 1 wherein the said at least one surface is exposed to an amide solution for 30 seconds to 10 minutes prior to contacting with said catalytic metal salt or metal complex solution or both to thereby swell the said at least one surface.

3. The method of claim 2 wherein the amide is N,N-dimethyl formamide solution.

4. The method of claim 1 wherein a composition containing at least about 0.1 mM of said catalytic metal salt or metal complex solution or both contacts said at least one surface.

5. The method of claim 4 wherein said composition contains about 0.5 to about 5 mM of said catalytic metal salt or metal complex solution or both.

6. The method of claim 1 wherein said metal salt or metal complex is a precious metal salt or metal complex.

7. The method of claim 1 wherein said catalytic metal salt or metal complex contains palladium, platinum, ruthenium, silver, copper, nickel, cobalt or gold ions.

8. The method of claim 7 wherein said salt is palladium chloride.

9. The method of claim 1 wherein said at least one surface is contacted simultaneously with said reducing agent and said electroless metal bath.

10. The method of claim 1 wherein said reducing agent is a borohydride, an amine-borane, a hypophospite or hydrazine.

11. The method of claim 1 wherein said reducing agent is formaldehyde.

12. The method of claim 1 wherein said reducing agent is an organic compound in an anionic form.

13. The method of claim 1 wherein said reducing agent is an alkali metal complex of an organic compound in an anionic state.

14. The method of claim 1 wherein said metal plating bath is a copper plating bath.

15. The method of claim 1 wherein said plating bath is selected from the group of nickel, copper, cobalt, palladium, gold and silver plating baths.

16. The method of claim 1 wherein said second catalytic metal salt contains palladium ions.

17. A method for conditioning at least one surface of a dielectric substrate for the electroless plating of a conductive metal thereon, which comprises:
obtaining a substrate of a dielectric material containing metal particles therein; contacting at least one surface of said substrate containing metal particles with a catalytic metal salt or metal complex or both whereby the cation of said catalytic metal salt or metal complex or both undergoes ion exchange with said metal particles to deposit metal as zero-valent atoms of said cation on said at least one surface; and then contacting said at least one surface with an electroless metal plating bath after contacting with said catalytic metal salt or a metal complex or both to thereby deposit a metal layer thereon.

18. The method of claim 17 wherein said metal particles include copper.

19. The method of claim 17 wherein said metal salt or metal complex is a precious metal salt or metal complex.

20. The method of claim 17 wherein said metal salt is palladium chloride.

21. The method of claim 17 which further includes rinsing the substrate in acidified water after contact with said metal salt.

22. A method for conditioning at least one surface of a dielectric substrate material for the electroless plating of a conductive metal pattern thereon which comprises:
contacting said at least one surface with a catalytic metal salt solution or metal complex solution or both;
contacting the said at least one surface with a reducing agent to reduce the metal cations to zero-valent metal;
then applying a permanent resist material to the surface to form a patterned layer on the substrate;
then contacting said at least one surface having a patterned resist layer with an electroless metal plating bath to deposit said metal in the zero-oxidation state on said at least one surface onto those areas not covered by the resist material.

23. The method of claim 1 which further includes applying a permanent resist material to the surface to form a patterned layer on the said at least one surface and then:
contacting with an electroless metal plating bath to deposit said metal in the zero-oxidation state on said at least one surface onto those areas not covered by the resist material.

24. The method of claim 1 which further includes applying a non-permanent resist material to the surface and then removing the non-permanent resist material following the electroless plating.

25. A method for conditioning at least one surface of a dielectric substrate material for the electroless plating of a conductive metal pattern thereon which comprises:
contacting said at least one surface with a catalytic metal salt or metal complex solution or bath;
then applying a resist material to the surface to form a patterned layer on the said at least one surface;
then contacting the said at least one surface with a reducing agent to reduce the metal and then contacting said at least one surface having a patterned resist layer with an electroless metal plating bath to deposit said metal in the zero-oxidation state on said at least one surface onto those regions not covered by the resist.

26. The method of claim 1 wherein said dielectric substrate is a polymeric material.

27. The method of claim 26 wherein the said at least one surface is exposed to a solvent prior to contacting with said catalytic metal salt of metal complex solution or both to thereby swell the said at least one surface.

28. The method of claim 27 wherein the said at least one surface is exposed to an amide solution for 30 seconds to 10 minutes prior to contacting with said catalytic metal salt or metal complex solution or both.

* * * * *